United States Patent [19]

Nishizaka

[11] Patent Number: 4,981,812

[45] Date of Patent: Jan. 1, 1991

[54] PROCESS FOR FABRICATING A SEMICONDUCTOR READ ONLY MEMORY

[75] Inventor: Teiichiro Nishizaka, Tokyo, Japan

[73] Assignee: NEC Corporation, Japan

[21] Appl. No.: 451,211

[22] Filed: Dec. 15, 1989

[30] Foreign Application Priority Data

Dec. 17, 1988 [JP] Japan .................. 63-318803

[51] Int. Cl.$^5$ .......................... H01L 21/70
[52] U.S. Cl. ....................... 437/52; 437/41; 437/62; 437/200
[58] Field of Search .......... 148/DIG. 109, DIG. 133, 148/DIG. 50; 437/52, 63, 62, 41, 64

[56] References Cited

U.S. PATENT DOCUMENTS

| 4,473,598 | 10/1984 | Ephrath et al. ............ 437/67 |
| 4,546,538 | 10/1985 | Suzuki ..................... 437/67 |
| 4,589,193 | 5/1986 | Goth et al. ............. 148/DIG. 19 |
| 4,740,480 | 4/1988 | Doka ...................... 437/61 |
| 4,851,366 | 7/1989 | Blanchard ................. 437/64 |

FOREIGN PATENT DOCUMENTS

130458 6/1984 Japan .................. 437/240

Primary Examiner—Brian E. Hearn
Assistant Examiner—Linda J. Fleck
Attorney, Agent, or Firm—Laff, Whitesel, Conte & Saret

[57] ABSTRACT

In a process for fabricating a semiconductor read only memory, a gate oxidation film is grown on a semiconductor substrate, and a first polycrystalline silicon layer is then grown on the gate oxidation film. The semicondctor substrate is provided with element separating trenches each passing through the gate oxidation film. Then, the element separating trenches are buried with a seccond polycrystalline silicon layer which provides no contamination for a channel portion and the gate oxidation film.

3 Claims, 11 Drawing Sheets

PROCESS FOR FABRICATING A SEMICONDUCTOR READ ONLY MEMORY

FIELD OF THE INVENTION

This invention relates to a process for fabricating a semiconductor read only memory, and more particularly to, a process for fabricating a read only memory in which each memory element is separated by trenches.

BACKGROUND OF THE INVENTION

A density of a read only memory (defined "ROM" hereinafter) integrated circuit has been much increased in these days. In accordance with the increase of this integrated circuit density, means for separating memory elements from each other have been changing from selective oxidation separation to trench separation.

In a conventional process for providing the trench separation, field oxidation films are formed at predetermined regions on a p- semiconductor substrate by use of a selective oxidation method at a first stage. Although plural field oxidation films are provided on plural regions of the substrate, a limited section including only one field oxidation film will be explained hereinafter. At the next stage, a pad oxidation film having a thickness of 200 to 300 Å is formed at the remaining region on the p- semiconductor substrate, and silicon nitride film is formed on the field and pad oxidation films. Thereafter, element separating trenches are provided on the p- semiconductor substrate by use of photoresists.

Next, a trench oxidation film is formed on the inner surface of the element separating trenches, and an oxidation film is then formed on the silicon nitride film and the trench oxidation films by providing an oxide having a high re-flow property such as BPSG, etc. After this, the high re-flow property oxidation film is re-flowed by a heat treatment of approximately 900° to 1000° C.

At the following stage, the re-flowed oxidation film is etched back to be left in the element separating trenches, so that the top surface of the film is above the top surface of the p- semiconductor substrate, and the silicon nitride film and the pad oxidation film are successively removed. Then, a gate oxidation film is formed on the p- semiconductor substrate thus processed, and a polycrystal silicon layer and a WSi layer are successively grown on the gate oxidation film.

Thereafter, a gate electrode is provided by defining the polycrystalline silicon layer and the WSi layer to be a predetermined pattern, and impurities are then injected to provide a source and a drain of a transistor, and then to provide a ROM code.

Finally, an interface insulation film is formed to be provided with contact holes, and aluminum wiring is provided in a predetermined pattern.

However, the conventional process for fabricating a semiconductor ROM has a disadvantage in that the gate oxidation film and a channel portion of a transistor are liable to be contaminated with phosphorus, because phosphorus contained in the element separating oxidation film is evaporated. The element separating oxidation film usually contains impurities such as phosphorus, etc. to provide a high re-flow property.

The conventional process for fabricating a semiconductor ROM has a further disadvantage in that the element separating oxidation film does not function as an element separating means, due to a short circuit between digit lines resulted from the occurence of an inverted layer on the sides of, and beneath the element separating trench, because the element separating oxidation film, for which BPSG, etc. is used to provide a sufficient re-flow property, is liable to be charged up by a positive potential, and the charged-up potential is increased in a practical use.

SUMMARY OF THE INVENTION

Accordingly, it is an object of this invention to provide a process for fabricating a semiconductor ROM, in which a transistor having no contaminated gate oxidation film and channel portion is obtained.

It is a further object of the invention to provide a process for fabricating a semiconductor ROM, in which a transistor having no deterioration on a function of an element separation is obtained.

It is a still further object of the invention to provide a process for fabricating a semiconductor ROM, a fabricating time of which is shortened.

According to this invention, a process for fabricating a semiconductor ROM, comprises the steps of:

growing a gate insulating film on a semiconductor substrate;

growing a first polycrystalline silicon layer and a silicon nitride film on said gate insulating film;

providing element separating trenches each passing through said gate insulating film, said first polycrystalline silicon layer, and said silicon nitride film to reach said semiconductor substrate;

growing oxidation films on an inner surface of said element separating trenches;

growing a second polycrystalline silicon layer to be buried into said element separating trenches;

growing a thermal oxidation film on said second polycrystalline silicon layer by use of a mask utilizing said silicon nitride film;

providing a conductive layer on said first polycrystalline silicon layer and said thermal oxidation film after removing said silicon nitride film;

providing plural gate electrodes by selective etching of said conductive layer and said first polycrystalline silicon layer; and providing source and drain regions by use of a mask utilizing said gate electrodes.

BRIEF DESCRIPTION OF THE DRAWINGS

This invention will be explained in more detail in conjunction with appended drawings, wherein.

DETAILED DESCRIPTION OF THE PREFERRED EMBODIMENTS

Before explaining a process for fabricating a semiconductor ROM in the preferred embodiment according to the invention, the aforementioned conventional process for fabricating a semiconductor ROM will be explained in FIGS. 1A to 1E.

Figure 1A:
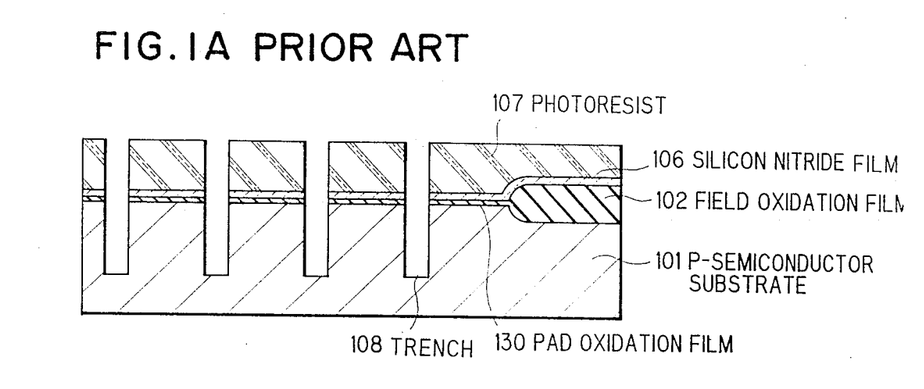
FIGS. 1A to 1E are cross-sectional views showing a conventional process for fabricating a semiconductor ROM.

FIG. 1A shows a field oxidation film 102 formed on a p- semiconductor substrat 101, a pad oxidation film 130 having a thickness of 200 to 300 Å formed thereon, and a silicon nitride 106 formed on the field and pad oxidation films 102 and 130. Then, element separating trenches 108 are provided by use of photoresists 107.

Figure 1B:
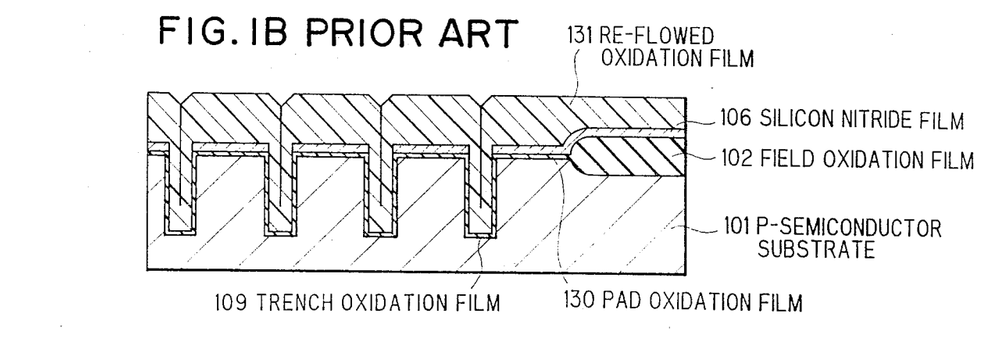

FIG. 1B shows oxidation of the surface of the trenches 108 to provide a trench oxidation film 109, and an oxidation film 131 having a high re-flow property which is then formed on the trench oxidation film 109 and the silicon nitride film 106. The oxidation film such as BPSG, etc. which is used as a high re-flow material is heat-treated at a temperature of 900° to 1000° C.

Figure 1C:
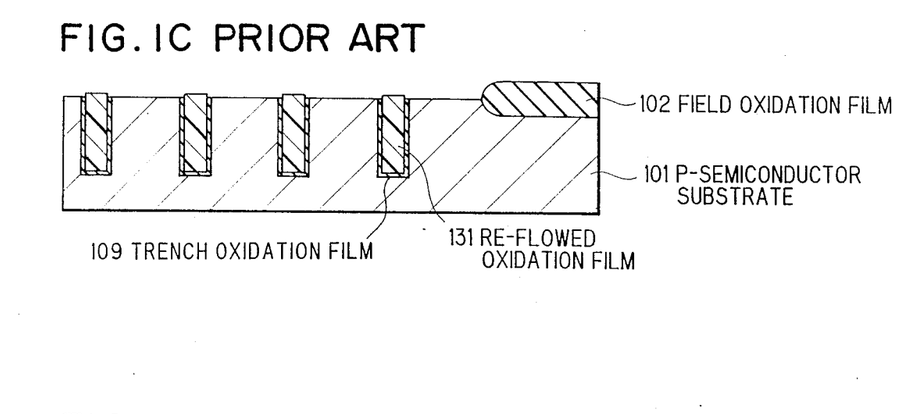

FIG. 1C shows the re-flowed oxidation film 131 which is etched back to a predetermined extent, and the removal of the silicon nitride film 106 and the pad oxidation film 130.

Figure 1D:
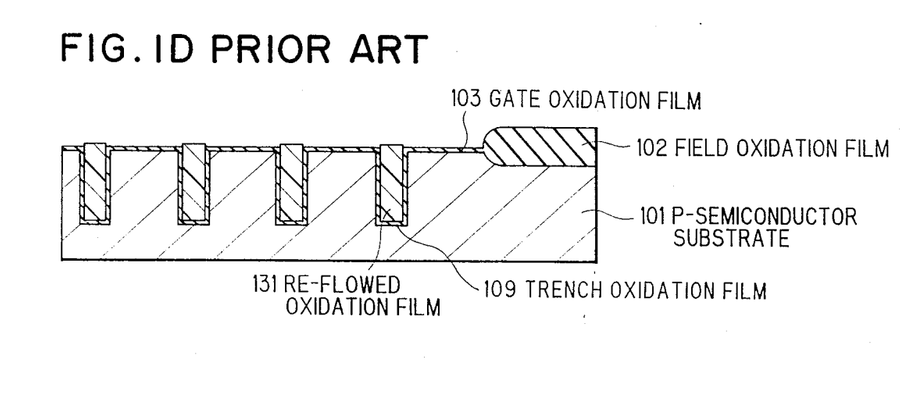

FIG. 1D shows a gate oxidation film 103 formed on the p- semiconductor substrate 101.

Figure 1E:
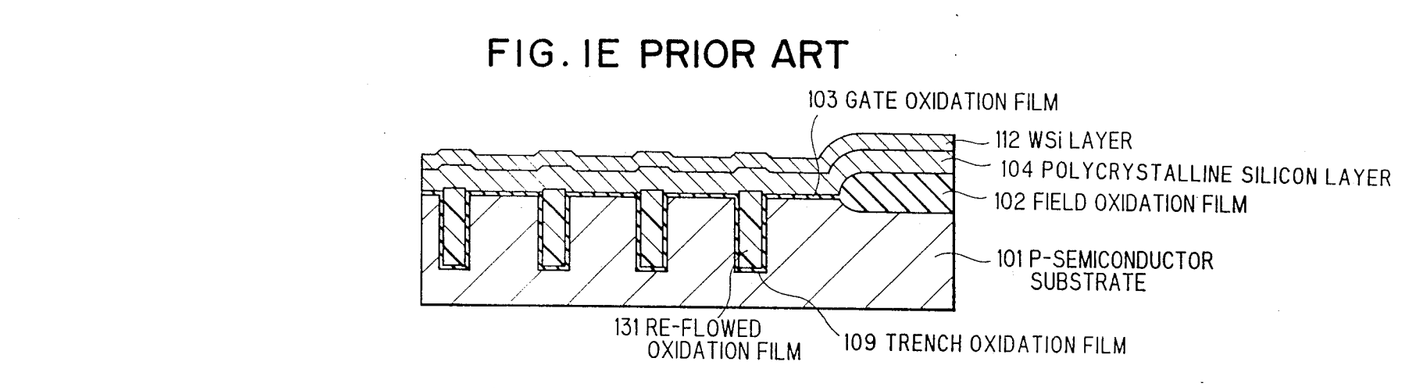

FIG. 1E shows a polycrystalline silicon layer 104 and a WSi layer 112 grown on the p- semiconductor substrate 101 having the gate oxidation film 103 and the field oxidation film 102 thereon. The both layers 104 and 112 is subject to a patterning process to provide a gate electrode, and the injection of impurities is carried out to provide a source and a drain, and then to provide a ROM code, as described before. Then, an interface insulation film and a contact aperture are provided, and aluminum wirings are finally provided to complete a semiconductor ROM.

Figure 2A:
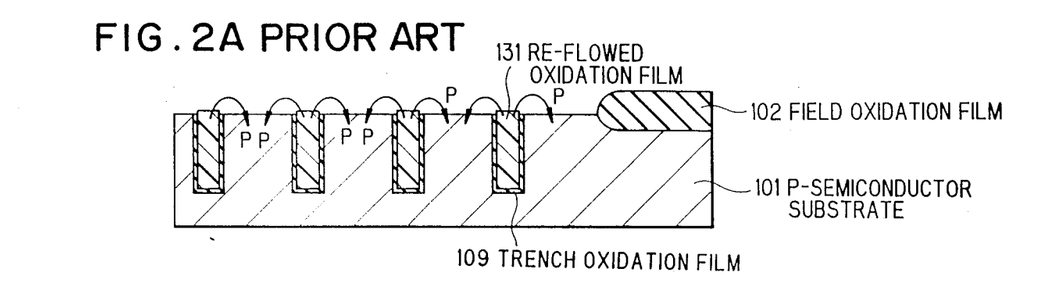
FIGS. 2A and 2B are cross-sectional views showing disadvantages in the conventional process for fabricating a semiconductor ROM.

FIG. 2A shows phosphorus P evaporated from the buried oxidation film 131 in an atmosphere of oxidation for the purpose of forming the gate oxidation film 103.

Figure 2B:
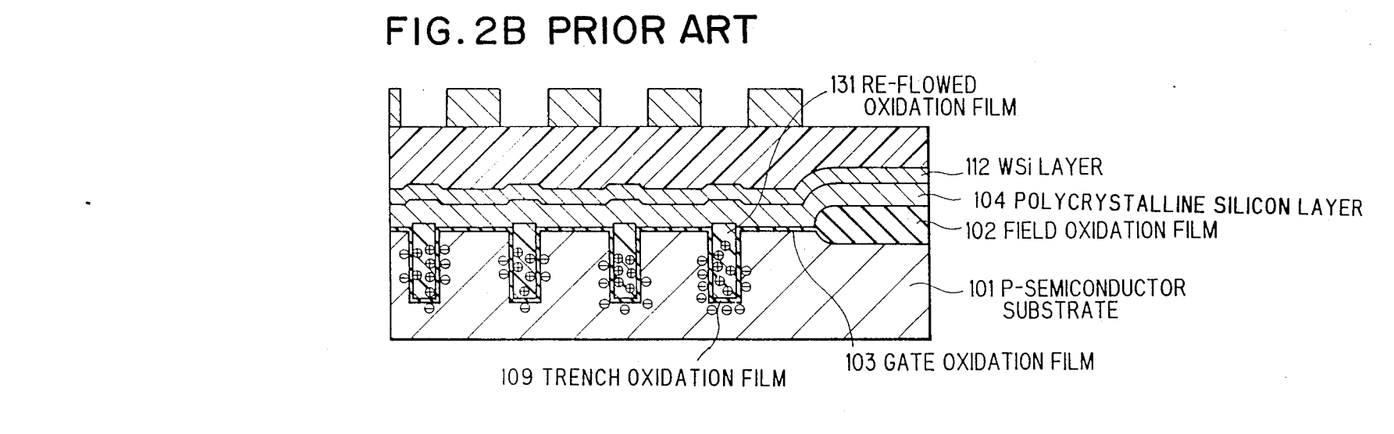

FIG. 2B shows an inverted layer of the negative potential generated in accordance with the positive potential of the buried oxidation film 131. The conventional process for fabricating a semiconductor ROM and the disadvantages thereof were explained before. Therefore, the detail thereof is not explained here.

Next, a process for fabricating a semiconductor ROM in the preferred embodiment according to the invention will be explained in FIGS. 3A to 3I, wherein FIGS. 3G to 3I and FIGS. 3J to 3L have cross-sections orthogonal to that of FIGS. 3A to 3F, as explained later in FIG. 4.

Figures 3A, 3B, 3C:
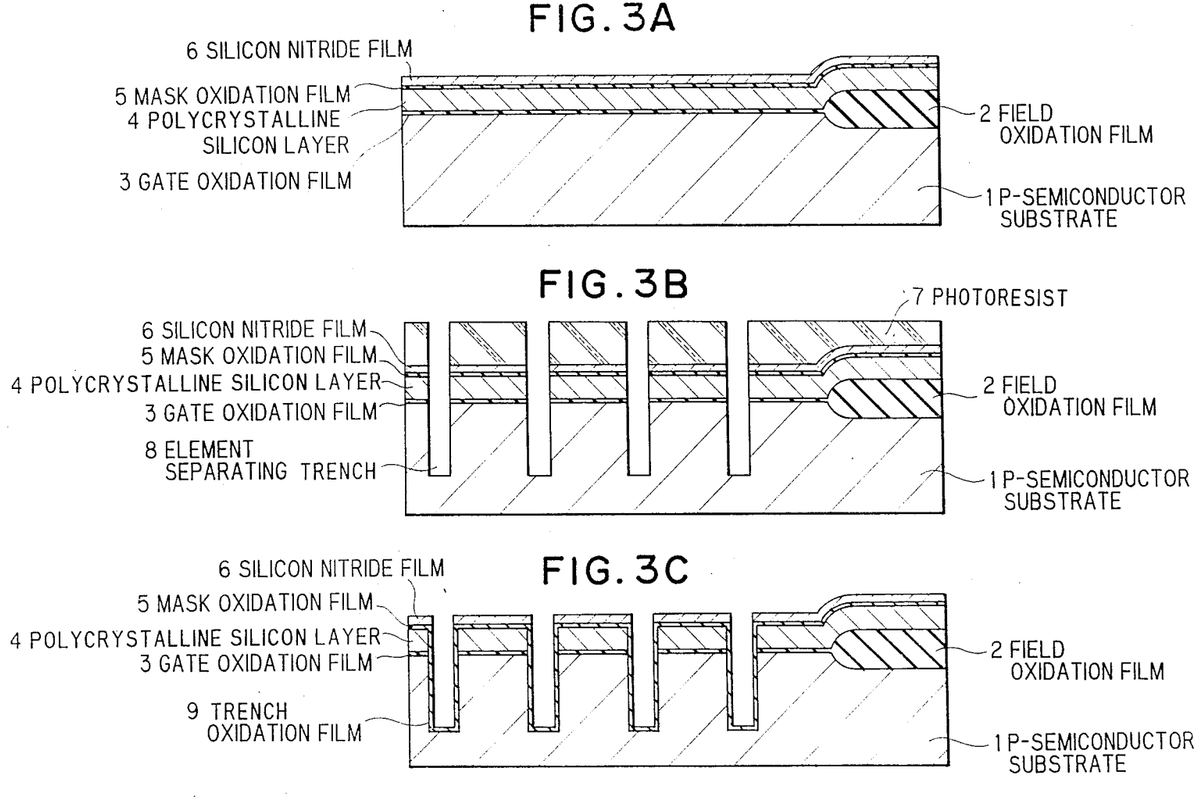
FIGS. 3A to 3L are cross-sectional views showing a process for fabricating a semiconductor ROM in a preferred embodiment according to the invention.

In FIG. 3A, a p- semiconductor substrate 1 is selectively oxidized on a predetermined region to provide a field oxidation film 2. Next, a gate oxidation film 3 having a thickness of approximately 50 Å is formed in an oxidizing atmosphere of 900° to 1000° C. Thereafter, a polycrystalline silicon layer 4 having a thickness of approximately 5000 Å is grown on the substrate 1 having the gate oxidation film 3 thereon, and a mask oxidation film 5 having a thickness of 300 to 500 Å is formed on the polycrystalline silicon layer 4 in an oxidizing atmosphere of approximately 900° C. Furthermore, a silicon nitride film 6 is formed on the mask oxidation film 5.

In FIG. 3B, the silicon nitride film 6, the mask oxidation film 5, the polycrystalline silicon layer 4, the gate oxidation film 3, and an upper portion of the substrate 1 are selectively etched to provide element separating trenches 8 by use of photoresists 7.

In FIG. 3C, the photoresists 7 are removed, and an inner surface of the element separating trenches 8 is oxidized to provide trench oxidation films 9 by use of the silicon nitride film 6 as a mask. The trench oxidation films 9 are obtained to be 300 to 500 Å in thickness in accordance with a high temperature oxidation of approximately 1000° C.

Figure 3D:
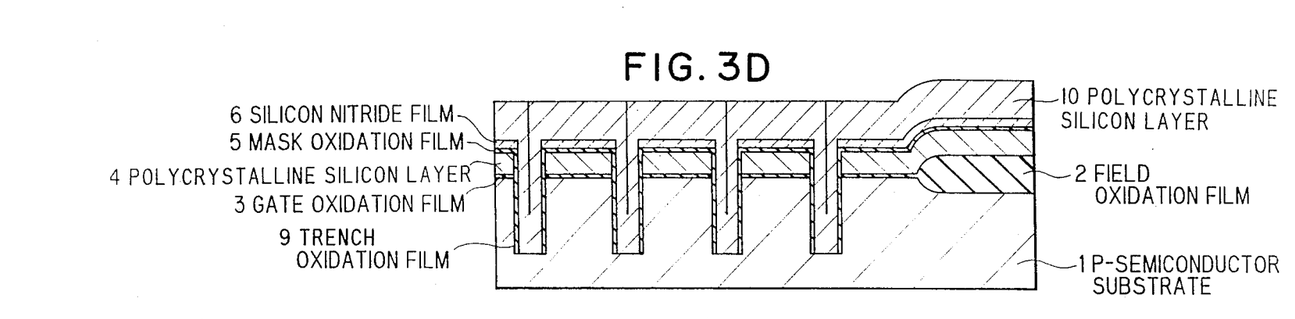

In FIG. 3D, the trench oxidation films 9 are removed on the bottom surface of the element separating trenches 8 by using a strong anisotropic etching, and a polycrystalline silicon layer 10 is grown on an overall surface of the substrate 1, so that the element separating trenches 8 are buried with the polycrystalline silicon layer 10. In this case, the buried polycrystalline silicon layer 10 may be doped with impurities to be the same conduction type as that of the substrate 1. Subsequently, the polycrystalline silicon layer 10 is etched back on the silicon nitride film 6.

Figure 3E:
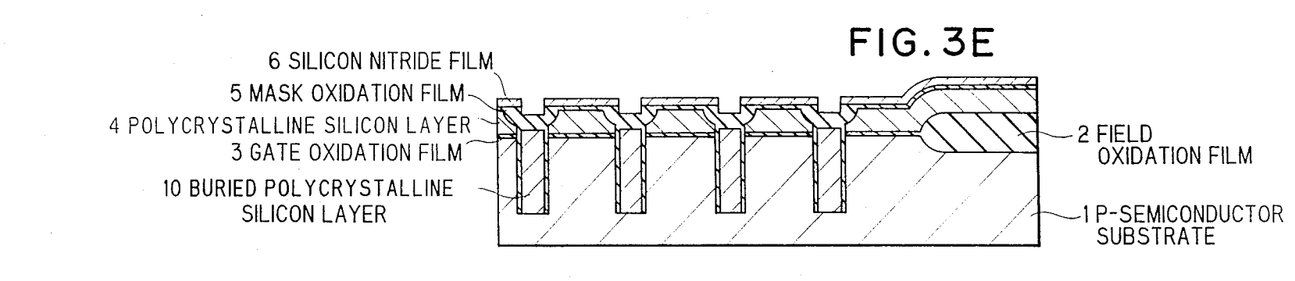

In FIG. 3E, the polycrystalline silicon layer 10 is etched back to a predetermined extent by use of the silicon nitride film 6 as a mask, and insulating oxidation films 11 are formed on the top surface of the polycrystalline silicon layer 10 and on the sides of the polycrystalline silicon layer 4. These insulating oxidation films 11 must be as sufficiently thick as 1000 to 3000 Å on the polycrystalline silicon layer 10 as compared to the mask oxidation film 5.

Figure 3F:
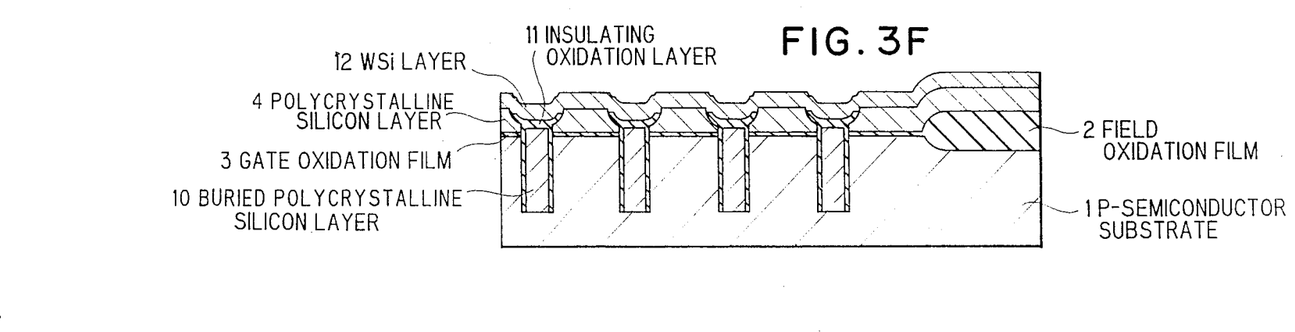

In FIG. 3F, the silicon nitride film 6 is removed by etching, and wet etching is then carried out to such an extent to remove the mask oxidation film 5. Here, diluted hydrogen fluoride acid solution is used as an etchant, so that the insulating oxidation film 11 is etched to be left by a thickness of more than 500 Å on the buried polycrystal silicon layer 10. Thereafter, a WSi layer 12 is provided on an overall surface of the substrate 1 to provide a gate electrode material. Thus, the gate electrode material is a two layered structure including the WSi and polycrystal silicon layers.

Figure 3G:
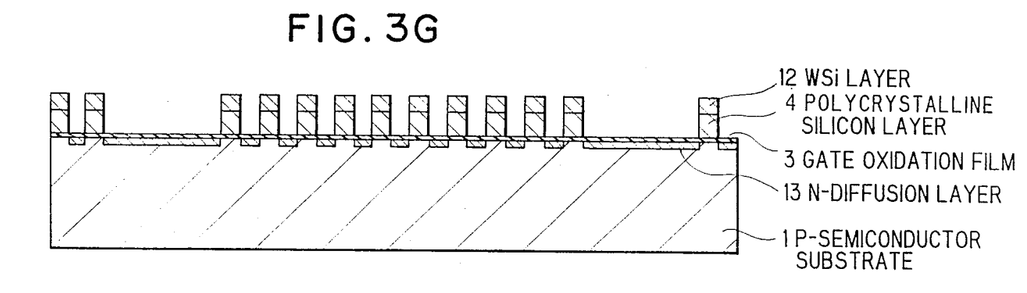

In FIG. 3G, the patterning of the WSi layer 12 and the polycrystalline silicon layer 4 is selectively carried out to provide gate electrodes which are then used as a mask for injecting As into the substrate 1 to provide N- diffusion layer 13. Thereafter, a mask is formed to provide a ROM code, and the mask is then removed.

Figure 3H:
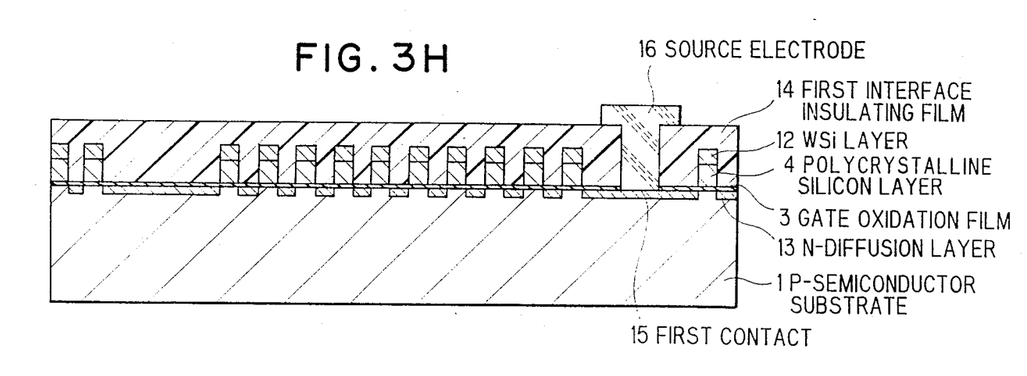

In FIG. 3H, a first interface insulating film 14, into which a first contact 15 is apertured on the source side of a memory cell array, is provided. Furthermore, a WSi wiring layer is selectively formed to provide a source electrode 16 which is in contact with the diffusion layer 13 on the side of a source. This source electrode 16 is also connected to the polycrystalline silicon layer 10, as described later.

Figure 3I:
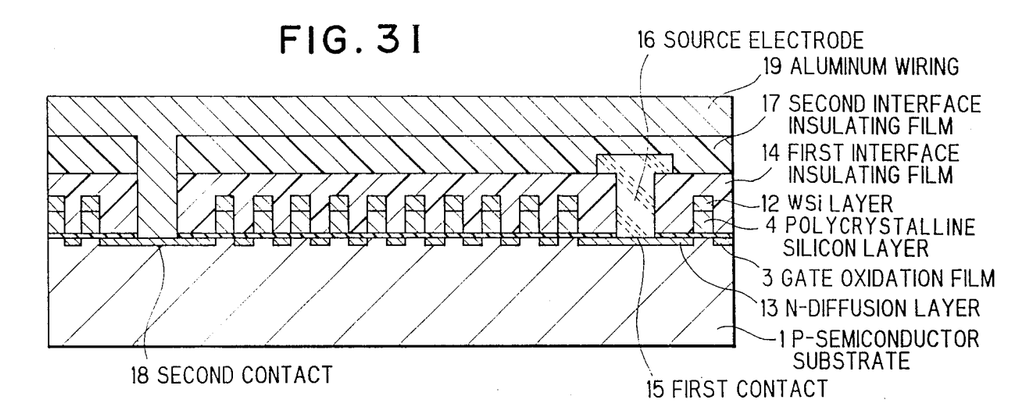

In FIG. 3I, finally, a second interface insulating film 17, into which a second contact 18 passing through the first interface insulating film 14 is apertured on the drain side of the memory cell array, is provided, and an aluminum wiring 19 is then provided to be in contact with the second contact 18.

Figure 3J:
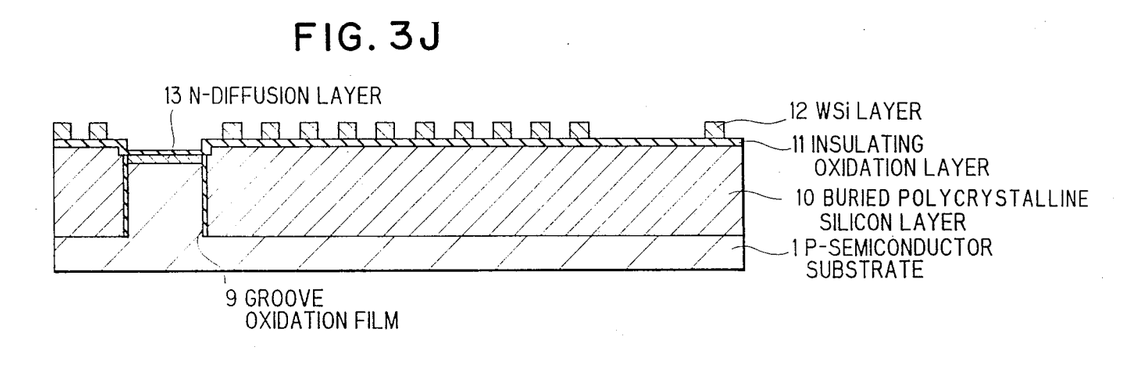

Cross-sections which are cut along cross-sections of the buried polycrystalline silicon layer 10 in FIGS. 3G to 3I are shown in FIGS. 3J to 3 L, wherein like parts are indicated by like reference numerals.

In FIG. 3J, N- impurities are not injected into the buried polycrystalline silicon layer 10 in the presence of the insulating oxidation film 11 in forming the N- diffusion layer 13.

Figure 3K:
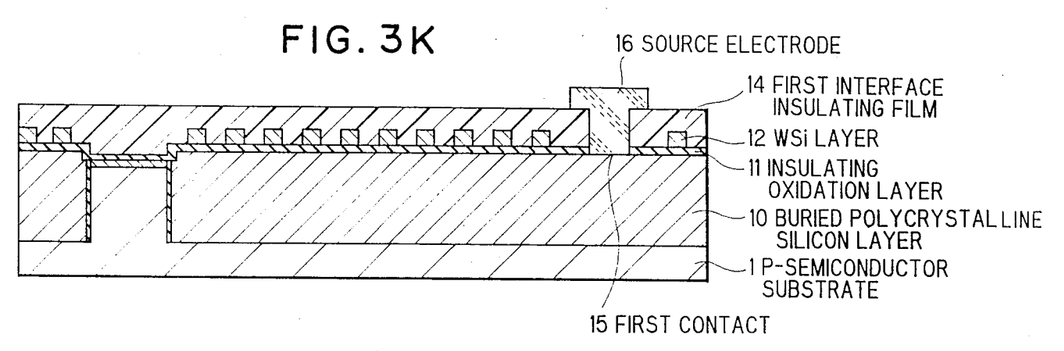

In FIG. 3K, the source electrode 16 is directly connected to the buried polycrystalline silicon layer 10. This source electrode 16 is also connected to the source side of the memory cell array, as shown in FIG. 3H.

Figure 3L:
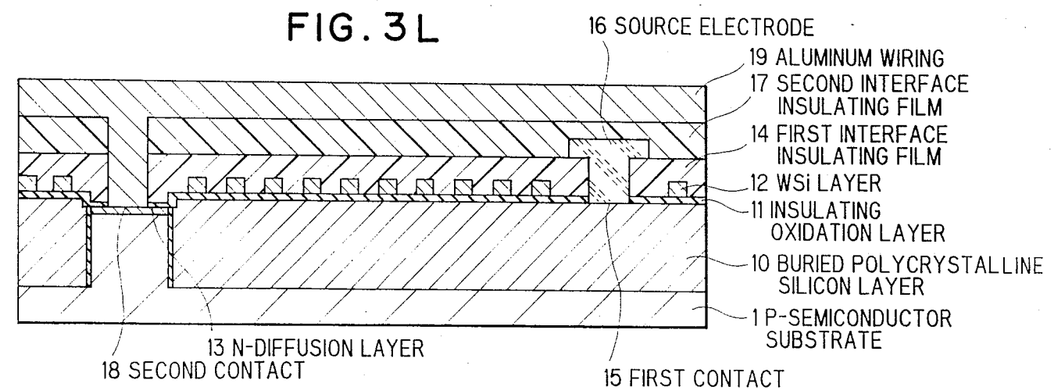
Figure 4:
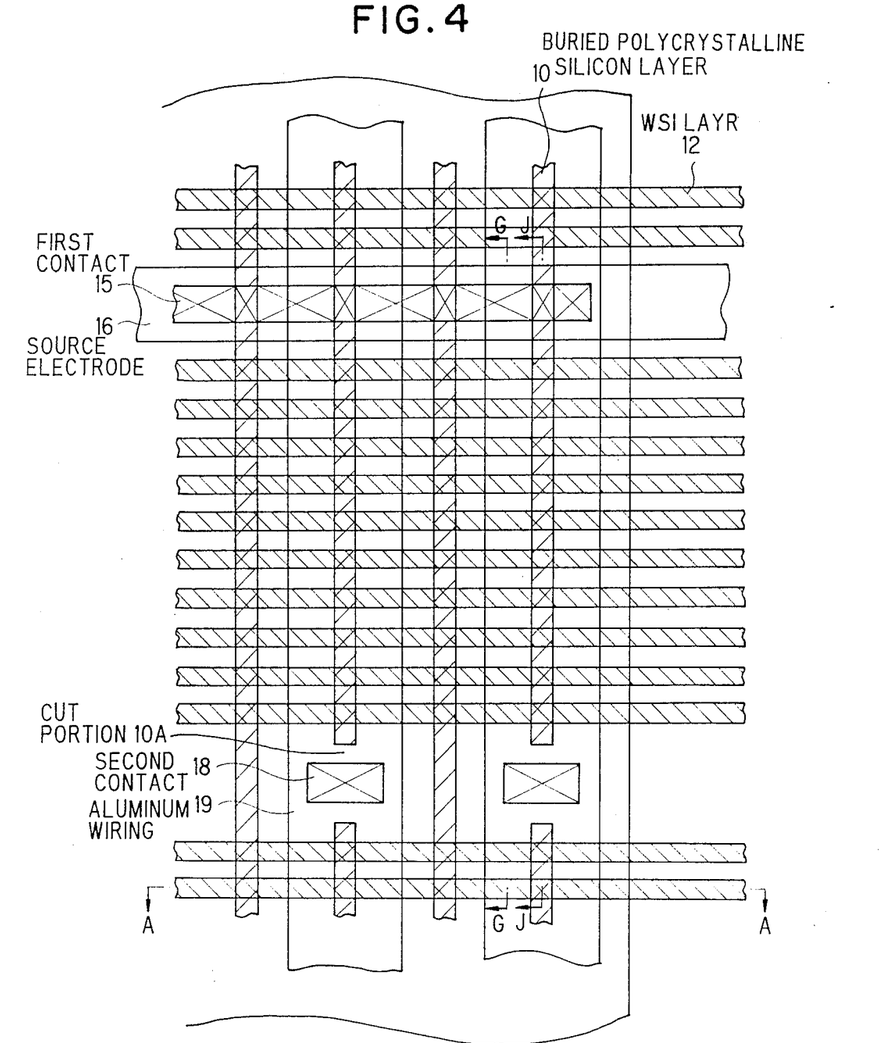
FIG. 4 is a plan view showing a semiconductor memory fabricated in the process for fabricating a semiconductor ROM in the preferred embodiment.

A semiconductor ROM which is fabricated in the process in the preferred embodiment is shown in FIG. 4, wherein like parts are indicated by like reference numerals. FIGS. 3A to 3F show the cross-section cut along a line A—A in FIG. 4, FIGS. 3G to 3I show the cross-section cut along a line G—G therein, and FIGS. 3J to 3L show the cross-section cut along a line J—J therein. As clearly understood from the illustration in FIG. 4, the plural buried polycrystalline silicon layers 10 and the plural WSi layers 12 are crossed each other, and the aluminum wiring 19 is positioned over the polycrystalline silicon layer 10 having a cut portion 10A, at which the second contact 18 is provided to reach the N-diffusion layer 13 (FIG. 3L). The source electrode 16 is connected through the first contact 15 to the polycrystalline silicon layer 10 (FIG. 3L).

Figure 5:
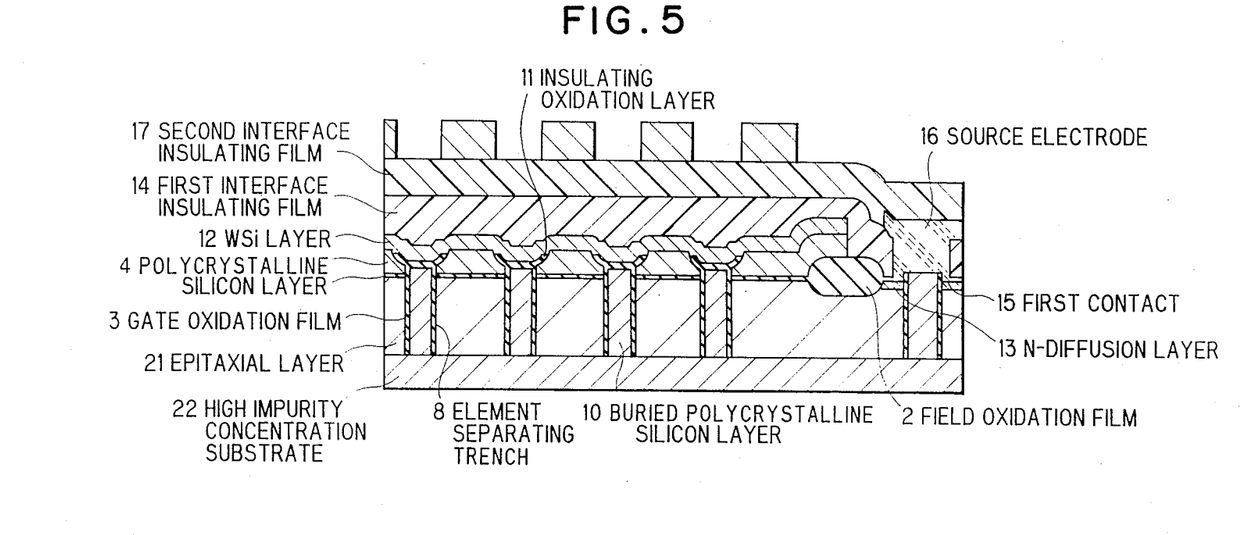
FIG. 5 is a cross-sectional view showing a semiconductor memory fabricated in a process for fabricating a semiconductor ROM in another preferred embodiment according to the invention.

FIG. 5 shows a process for fabricating a semiconductor ROM in another preferred embodiment according to the invention, wherein like parts are indicated by like reference numerals as used in FIGS. 3A to 3L. The process comprises steps of growing an epitaxial layer 21 on a high impurity concentration substrate 20, providing the epitaxial layer 21 with element separating trenches 8 which reach the substrate 20, and burying the trenches 8 with the polycrystalline silicon layer 10, after being provided with the trench oxidation film 9 on the inner surface thereof. As a result, the substrate 20 is effectively held at the ground potential in a stable manner, so that a semiconductor ROM thus fabricated is provided with a stable device characteristic.

As described above, a process for fabricating a semiconductor ROM according to the invention comprises steps of, providing a gate oxidation film directly or indirectly on a semiconductor substrate, providing a first polycrystalline silicon layer partly being a gate electrode on the gate oxidation film, providing the semiconductor substrate or an epitaxial layer grown thereon with element separating trenches, and burying the element separating trenches with a second polycrystalline silicon layer. Therefore, following advantages are obtained in the invention.

(1) A channel portion and a gate oxidation film are not contaminated in a fabricating process, so that a transistor having a stable characteristic is obtained, because no contamination source exsists.

(2) A short circuit is avoided between digit lines, because no charge is accumulated in a polycrystalline silicon layer which is buried into element separating trenches. Furthermore, if the polycrystalline silicon layer is connected to a semiconductor substrate, and connected through a source electrode to the ground potential, the semiconductor substrate is easily connected to the ground potential, so that the transistor operates with a stable characteristic.

(3) A fabricating time is shortened in accordance with the presence of a first polycrystalline silicon layer, because the first polycrystalline silicon layer partly being a gate electrode plays a role of spacers in an etching-back stage for providing a second polycrystalline silicon layer.

Although the invention has been described with respect to specific embodiment for complete and clear disclosure, the appended claims are not to be thus limited but are to be construed as embodying all midifications and alternative constructions that may occur to one skilled in the art which fairly fall within the basic teaching herein set forth.

What is claimed is:

1. A process for fabricating a semiconductor read only memory, comprising the steps of:
   growing a gate insulating film on a semiconductor substrate;
   growing a first polycrystalline silicon layer and a silicon nitride film on said gate insulating film;
   providing element separating trenches each passing through said gate insulating film, said first polycrystalline silicon layer, and said silicon nitride film to reach said semiconductor substrate;
   growing oxidation films on an inner surface of said element separating trenches;
   growing a second polycrystalline silicon layer to be buried into said element separating trenches;
   growing a thermal oxidation film on said second polycrystalline silicon layer by use of a mask utilizing said silicon nitride film;
   providing a conductive layer on said first polycrystalline silicon layer and said thermal oxidation film after removing said silicon nitride film;
   providing plural gate electrodes by selective etching of said conductive layer and said first polycrystalline silicon layer; and
   providing source and drain regions by use of a mask utilizing said gate electrodes.

2. A process for fabricating a semiconductor read only memory, according to claim 1, wherein:
   said semiconductor substrate, includes:
   a semiconductor substrate doped with impurities by a high concentration; and
   an epitaxial layer grown on said doped semiconductor substrate; and
   said element separating trenches are provided by an entire thickness of said epitaxial layer.

3. A process for fabricating a semiconductor read only memory, comprising the steps of:
   providing a field oxidation film selectively on a semiconductor substrate;
   growing a gate oxidation film on said semiconductor substrate;
   growing a first polycrystalline silicon layer having a predetermined thickness on said field oxidation film;
   growing a mask oxidation film having a predetermined thickness on said first polycrystalline silicon layer;
   providing a silicon nitride film on said mask oxidation film;
   providing photoresists on said silicon nitride film;
   providing element separating trenches each reaching said semiconductor substrate with a predetermined depth by use of said photoresists;
   removing said photoresists out of an surface of said silicon nitride;
   growing trench oxidation films on an inner surface of said element separating trenches;
   removing said trench oxidation films on each bottom surface of said element separating trenches;
   providing a second polycrystalline silicon layer in said element separating trenches and on said silicon nitride film;
   etching said second polycrystalline silicon layer selectively by use of a mask of said silicon nitride film;

growing insulating oxidation film each having a predetermined thickness on said second polycrystalline silicon layers selectively left in said etching;

removing said silicon nitride film and said mask oxidation films over a surface of said semiconductor substrate;

forming WSi layer over said surface of said semiconductor substrate to provide a gate electrode;

providing an impurity diffusion layer in said semiconductor substrate by use of a mask of said gate electrode;

forming a mask to provide a ROM code and removing said mask of said ROM code after said ROM code is provided;

providing a first insulating film having a first contact over said semiconductor substrate;

forming WSi wiring layer passing through said first contact to reach said impurity diffusion layer, thereby providing a source electrode;

providing a second insulating film having a second contact over said semiconductor substrate; and forming aluminum wiring layer passing through said second contact to reach said impurity diffusion layer, thereby providing a drain electrode.

* * * * *